United States Patent [19]
Sakaue et al.

[11] Patent Number: 5,577,080
[45] Date of Patent: Nov. 19, 1996

[54] DIGITAL PHASE-LOCKED LOOP CIRCUIT WITH FILTER COEFFICIENT GENERATOR

[75] Inventors: Kenji Sakaue, Yokohama; Koji Ogura, Kawasaki, both of Japan

[73] Assignee: Kabushiki Kaisha Toshiba, Tokyo, Japan

[21] Appl. No.: 201,644

[22] Filed: Feb. 25, 1994

[30] Foreign Application Priority Data

Feb. 26, 1993 [JP] Japan ................................. 5-038022

[51] Int. Cl.⁶ ........................................................ H03D 3/24
[52] U.S. Cl. ........................... 375/376; 375/373; 375/327; 327/156
[58] Field of Search ...................... 375/376, 222, 375/371, 373, 344, 350, 374, 294, 327; 331/17, 1 A, DIG. 2; 327/156, 159, 160, 150, 157; H03D 3/24

[56] References Cited

U.S. PATENT DOCUMENTS

| | | | |
|---|---|---|---|
| 4,791,386 | 12/1988 | Shiga | 327/156 |
| 5,057,794 | 10/1991 | Shih | 331/1 A |
| 5,349,309 | 9/1994 | Fujii | 331/17 |

FOREIGN PATENT DOCUMENTS 440029  2/1992  Japan .
555909  3/1993  Japan .

*Primary Examiner*—Kim Yen Vu
*Assistant Examiner*—Madeleine Anh-Vinh Nguyen
*Attorney, Agent, or Firm*—Loeb & Loeb LLP

[57] ABSTRACT

A digital phase-locked loop (DPLL) circuit, which achieves a high-precise phase matching between input and output clocks at high speed, irrespective of phase difference between both, is disclosed. The DPLL has a phase comparator for sequentially comparing an input clock with an output clock in phase and outputting phase comparison result signals; a random walk filter for sequentially adding and accumulating the comparison result signals inputted by the phase comparator, discriminating a relative magnitude between the obtained addition data and threshold value information, and outputting a frequency change signal corresponding to the discriminated result and the phase shift amount information; a variable frequency oscillator for generating the output clock and changing frequency of the output clock according to the frequency change signal; and a filter coefficient generating circuit for changing and outputting at least one of the outputted threshold value information and the phase shift amount information according to the phase synchronous status supplied from an operation status detecting circuit.

11 Claims, 8 Drawing Sheets

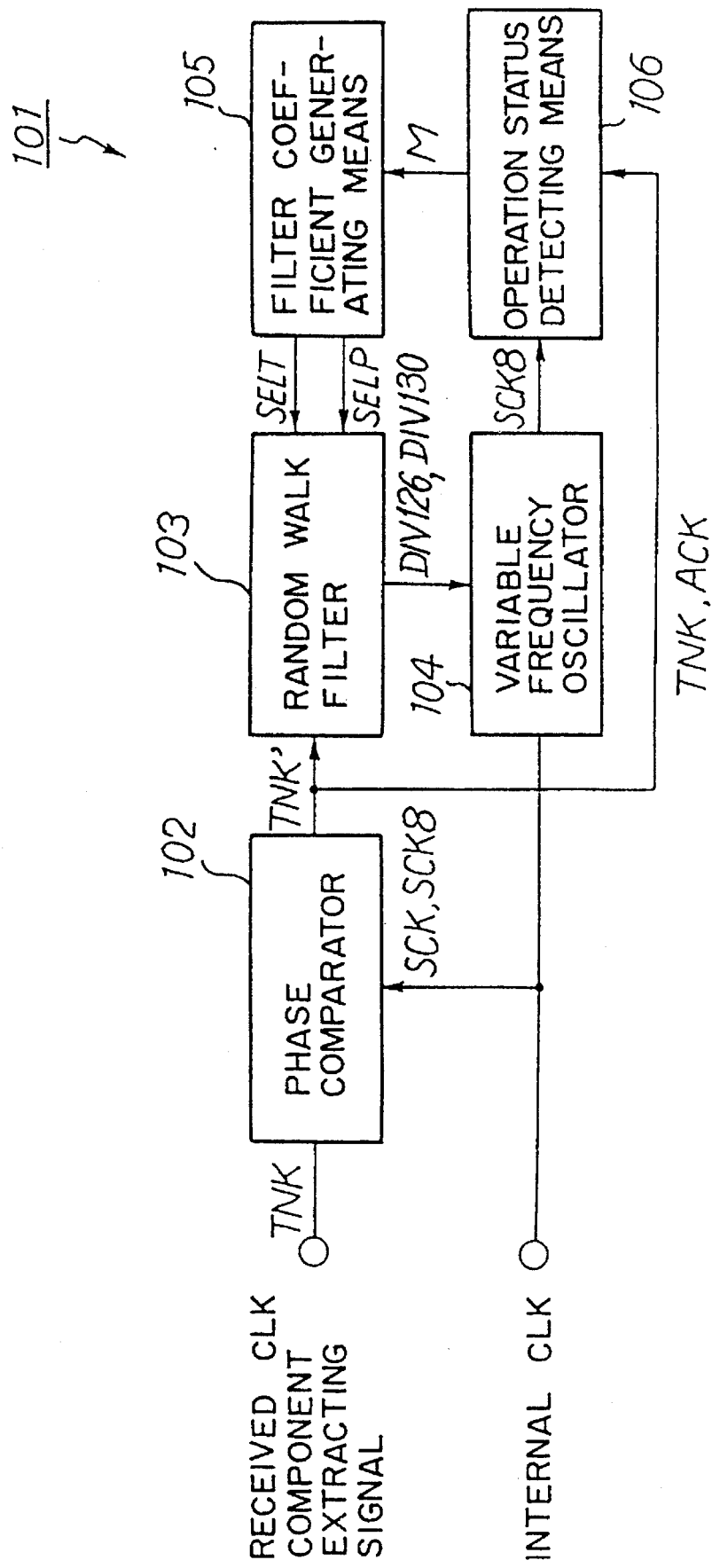
F I G. 1

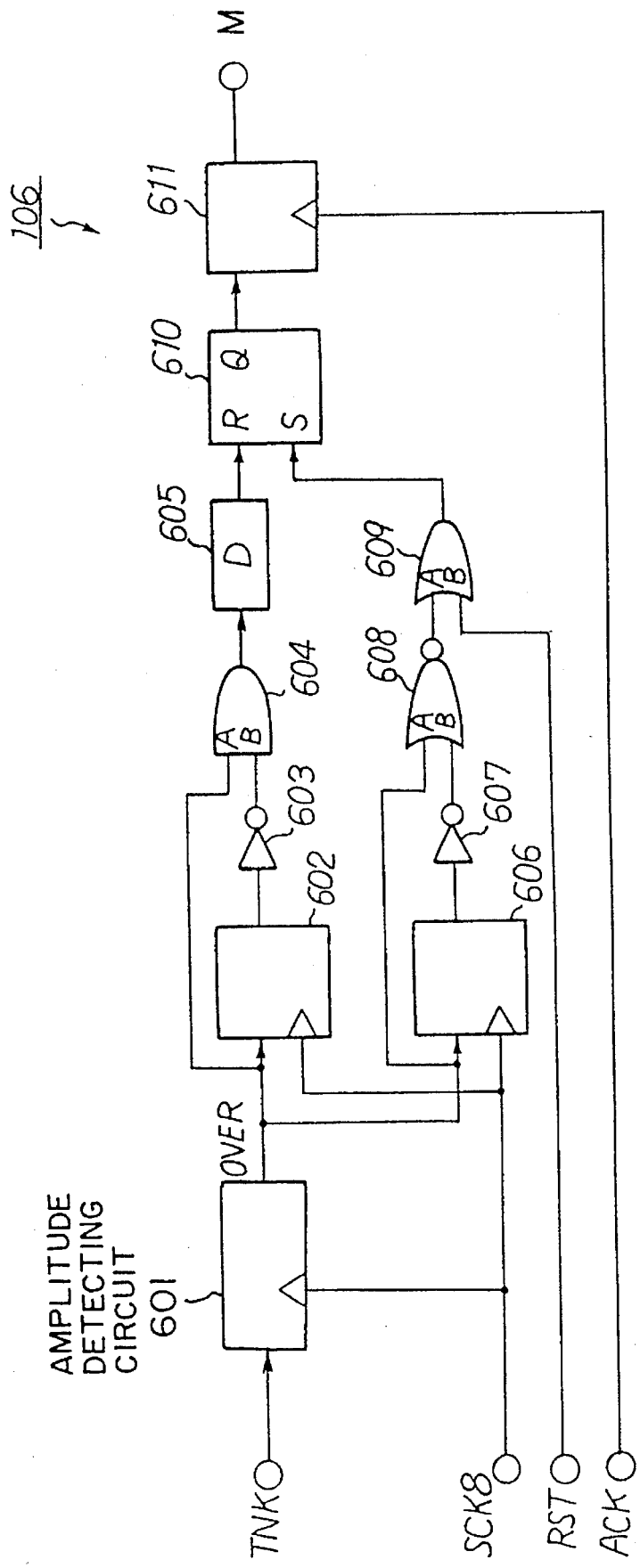
F I G. 6

FIG. 7A  RECEIVED CLK

FIG. 7B  RECEIVED CLK COMPONENT EXTRACTING SIGNAL (TNK)

FIG. 7C  INTERNAL CLK (SCK)

FIG. 7D  SAMPLING CLK (ACK)

DIGITAL PHASE-LOCKED LOOP CIRCUIT WITH FILTER COEFFICIENT GENERATOR

BACKGROUND OF THE INVENTION

1. Field of the Invention

The present invention is related to a digital phase-locked loop (referred to as DPLL, hereinafter) circuit used, for example in a modem (modulator-demodulator) of a portable radio telephone set.

2. Description of the Related Art

A conventional circuit will be described hereinbelow by taking the case of a modem incorporated in a portable radio telephone set.

In general, the DPLL circuit of this sort is provided with a function for generating an internal clock used for other circuits of the telephone set (referred to as internal or output clock, hereinafter) and a function for synchronizing the phase of the generated internal clock (i.e., an output clock) with that of a clock component of a received signal (i.e., an input clock).

An example of the DPLL circuit of this sort will be described hereinbelow with reference to FIG. 8, by way of example. In the drawing, a received analog signal $S_A$ is converted into digital received signals $S_D$ by an analog to digital converting circuit 705, detected by a delay detecting circuit 706, and further processed by a clock extracting narrow-band circuit (referred to as TANK circuit, hereinafter) 707 to extract received clock components corresponding to a symbol rate. Further, received clock component extracting signals TNK indicative of the clock components are supplied to a DPLL circuit 701.

As shown, the DPLL circuit 701 is composed of a phase comparator 702, a random walk filter 703 and a variable-frequency oscillator 704.

The phase comparator 702 inputs the received clock component extracting signals TNK and an internal clock SCK generated by the variable-frequency oscillator 704, and detects a phase difference between the two (TNK and SCK) for each cycle. The detected phase difference data for each cycle are outputted to the random walk filter 703.

The random walk filter 703 adds the inputted phase difference data for each cycle in sequence and accumulates the added data. Further, when the absolute value of the accumulated data exceeds a predetermined threshold value, the random walk filter 703 outputs a frequency change signal.

In response to this frequency change signal, the variable-frequency oscillator 704 changes the frequency of the internal clock for a predetermined time period according to the inputted frequency change signal. Owing to a change of the frequency of the internal clock SCK, the phase of the internal clock SCK is shifted in a direction that the phase of the internal clock SCK matches the phase of the received clock component extracting signal TNK.

In the above-mentioned conventional DPLL circuit 701, the threshold value in the random walk filter 703 and the phase shift amount (for each detection) of the internal clock in the variable-frequency oscillator 704 are both determined to be constant at all times.

However, the optimum values of the threshold voltage and the phase shift amount vary according to the phase difference between the internal clock and the received clock. In other words, when the phase difference is large, it is preferable to set the threshold value to a relatively low value and the phase shift amount to a relatively large value, in order to reduce the phase difference between the both TNK and SCK to zero during a relatively short time period. On the other hand, when the phase difference is small, it is preferable to set the threshold value to a relatively high value and the phase shift amount to a relatively small value, in order to match the both phases with respect to each other with a high precision.

Here, in general, the phase difference increases at the initial synchronous operation, and decreases in the continuous reception operation. In the conventional DPLL circuit 701, however, the threshold value and the phase shift amount are determined according to the magnitude of the phase difference detected in the continuous reception operation.

Therefore, in the conventional DPLL circuit, although a high precise phase matching operation can be realized in the continuous reception operation, it is difficult to realize the phase matching in a short time period in the initial synchronous operation, and thus it has been difficult to realize a high performance DPLL.

A symbol timing reproducing circuit is disclosed in Japanese Patent Laid-open (Kokai) No. 4-40029 (1992). In this circuit, the numbers of the overflows and/or underflows due to an initially determined inertia are accumulated, and the mode is updated when the accumulated value exceeds a threshold value m so that the inertia can be increased stepwise.

In this prior art circuit, however, since the inertia is controlled only by the phase difference information, there exists a problem in that in case the phase difference is reduced down to zero accidentally at the start of phase matching operation, the operation proceeds under a small inertial, so that it is impossible to decide the optimum inertial accurately according to the operating conditions of the DPLL circuit.

SUMMARY OF THE INVENTION

Accordingly, the object of the present invention is to provide a digital phase-locked loop circuit which can realize the phase matching operation at high precision at all times, irrespective of the magnitude of the phase difference.

To achieve the above-mentioned object, in the first aspect of the present invention, there is provided a digital phase-locked loop circuit for generating an output clock and for synchronizing the output clock with an input clock by shifting phase of the output clock, comprising:

phase comparing means for sequentially comparing the input clock with the output clock in phase and outputting comparison result signals;

filter means having:

an accumulation section for sequentially adding and accumulating the comparison result signals supplied from said phase comparing means and outputting the added and accumulated data as addition data;

a discrimination section for discriminating a relative magnitude between the addition data supplied from said accumulation section and threshold value information inputted from outside and outputting a discriminated result; and a frequency change signal generating section for outputting a frequency change signal corresponding to phase shift amount information inputted from outside according to the discriminated result inputted by said discrimination section;

oscillating means for generating the output clock and changing frequency of the output clock according to the frequency change signal supplied from said filter means; and filter coefficient generating means for outputting the threshold value information and the phase shift amount information, at least one of the outputted threshold value information and the phase shift amount information being changed according to phase synchronous status between the output clock and the input clock.

According to this invention, since the threshold value used for a discriminating section provided in filter means and the shift information used for a frequency change signal generating section are changed and determined appropriately by filter coefficient generating means according to the phase synchronous conditions, it is possible to realize a high precise less-jitter phase matching operation in a short time period.

Further, the filter coefficients are determined on the basis of the fact that the phase difference is relatively large from the start of the synchronous operation to a predetermined time (e.g., 20 msec), but becomes relatively small thereafter.

Further, in the second aspect of the present invention, there is provided a digital phase-locked loop circuit for generating an output clock and for synchronizing the output clock with an input clock by shifting phase of the output clock, comprising:

phase comparing means for sequentially comparing the input clock with the output clock in phase and outputting comparison result signals;

filter means having:
an accumulation section for sequentially adding and accumulating the comparison result signals supplied from said phase comparing means and outputting the added and accumulated data as addition data;

a discrimination section for discriminating a relative magnitude between the addition data supplied from said accumulation section and threshold value information externally applied and outputting a discriminated result; and a frequency change signal generating section for outputting a frequency change signal corresponding to phase shift amount information externally applied according to the discriminated result supplied from said discrimination section;

oscillating means for generating the output clock and changing frequency of the output clock according to the frequency change signal supplied from said filter means; and filter coefficient generating means for outputting the threshold value information and the phase shift amount information, at least one of the outputted threshold value information and the phase shift amount information being changed in response to a control signal externally applied.

According this invention, since the threshold value used for a discrimination section provided in the filter means and the shift information used for a frequency change signal generating section are changed and determined appropriately by the filter coefficient generating means in response to a control signal externally applied, it is possible to realize a high precise phase matching operation within a short time period.

BRIEF DESCRIPTION OF THE DRAWINGS

In the attached drawings:

FIG. 1 is a block diagram showing a first embodiment of the digital phase-locked loop circuit according to the present invention;

FIG. 6 is a block diagram showing the internal circuit configuration of the operation status detecting circuit shown in FIG. 1;

DETAILED DESCRIPTION OF THE PREFERRED EMBODIMENTS

An embodiment of the present invention will be described hereinbelow as if it is used in a modem of a portable radio telephone set.

FIG. 1 is a block diagram showing the DPLL (Digital Phase-Locked Loop) circuit according to the present invention. As shown, the circuit 101 comprises a phase comparator (phase comparing means) 102, a random walk filter (filter means) 103, a variable-frequency oscillator (oscillating means) 104, a filter coefficient generating circuit (filter coefficient generating means) 105, and an operation status detecting circuit (operation status detecting means) 106.

Further, FIGS. 2 to 6 show the internal circuit configurations of these circuits 102 to 106, respectively.

Figure 2:
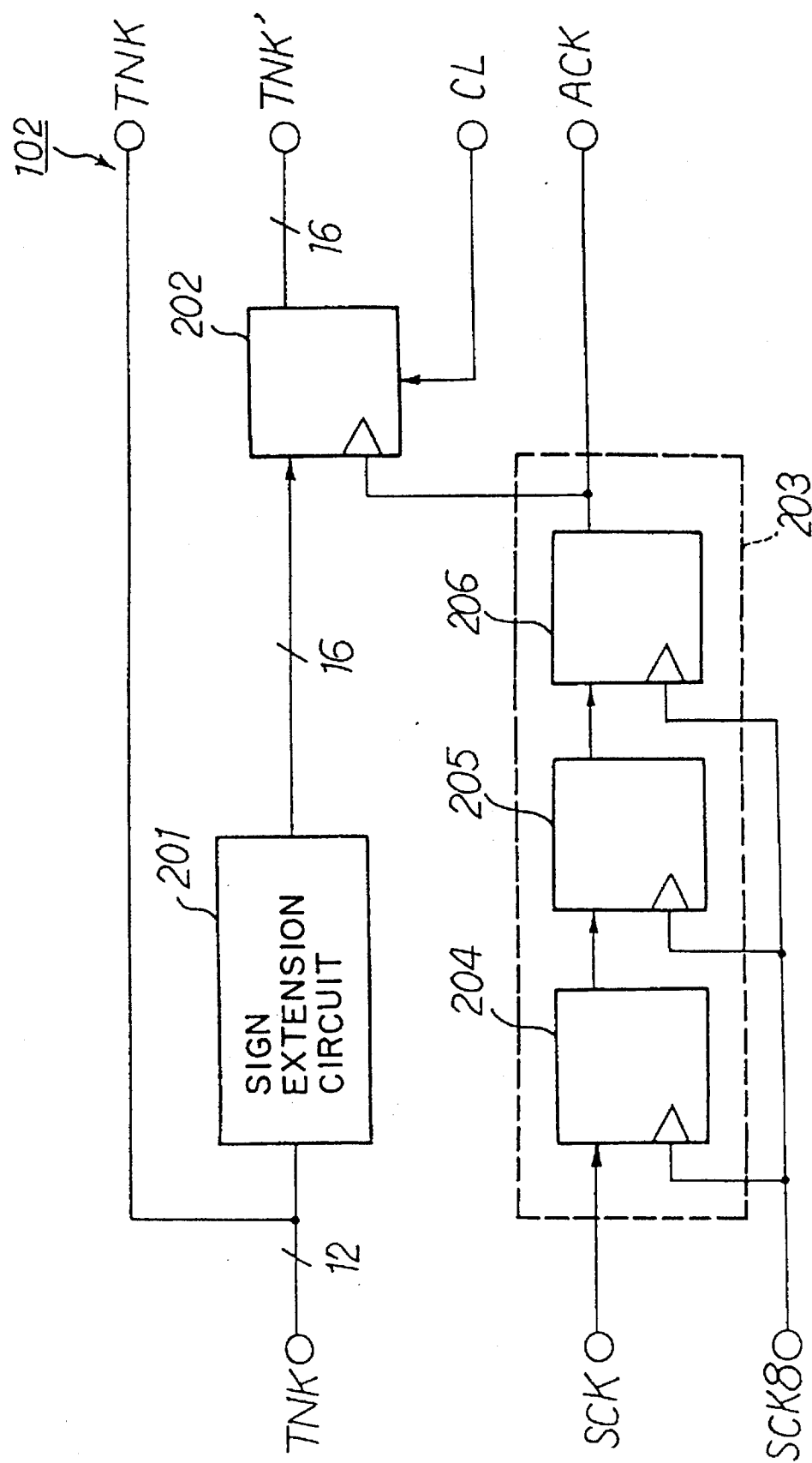
FIG. 2 is a block diagram showing the internal circuit configuration of the phase comparator shown in FIG. 1.
Figure 7:
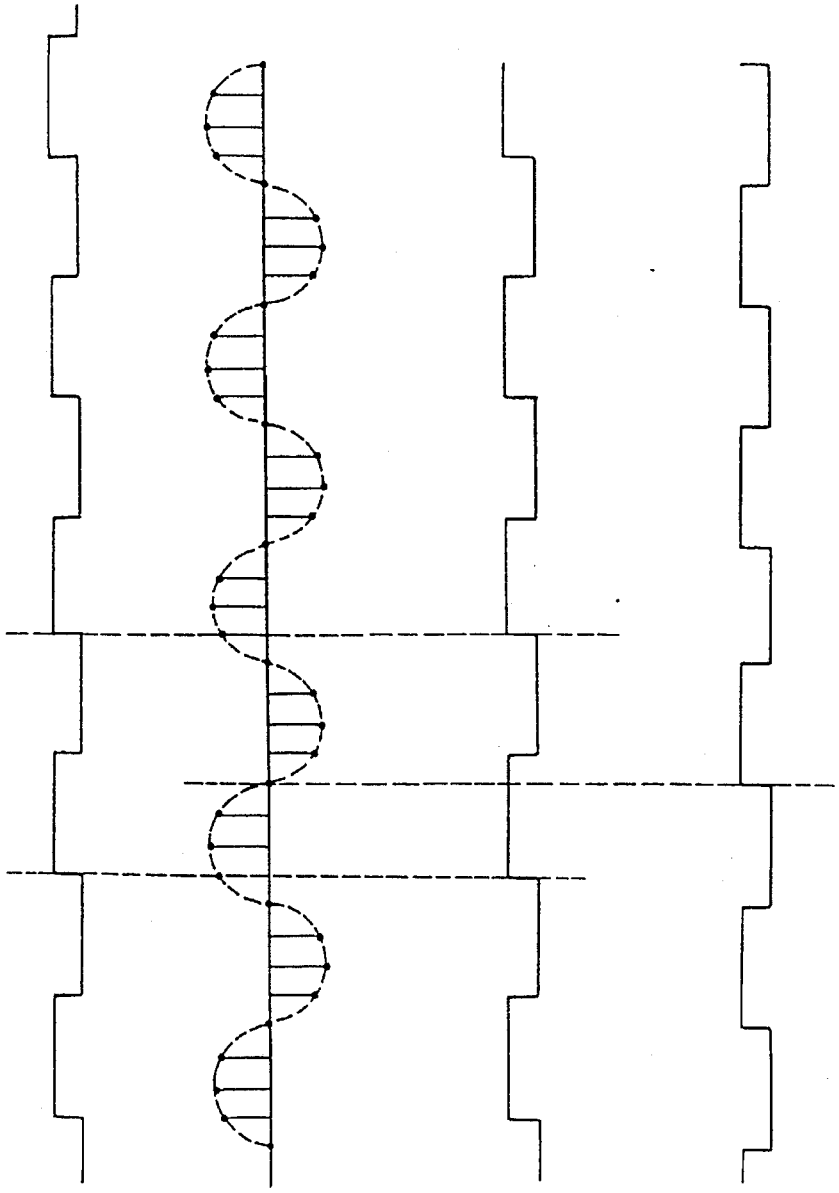
FIGS. 7A–7D are timing charts showing the major internal circuit signals of the digital phase-locked loop circuit shown in FIG. 1.
Figure 8:
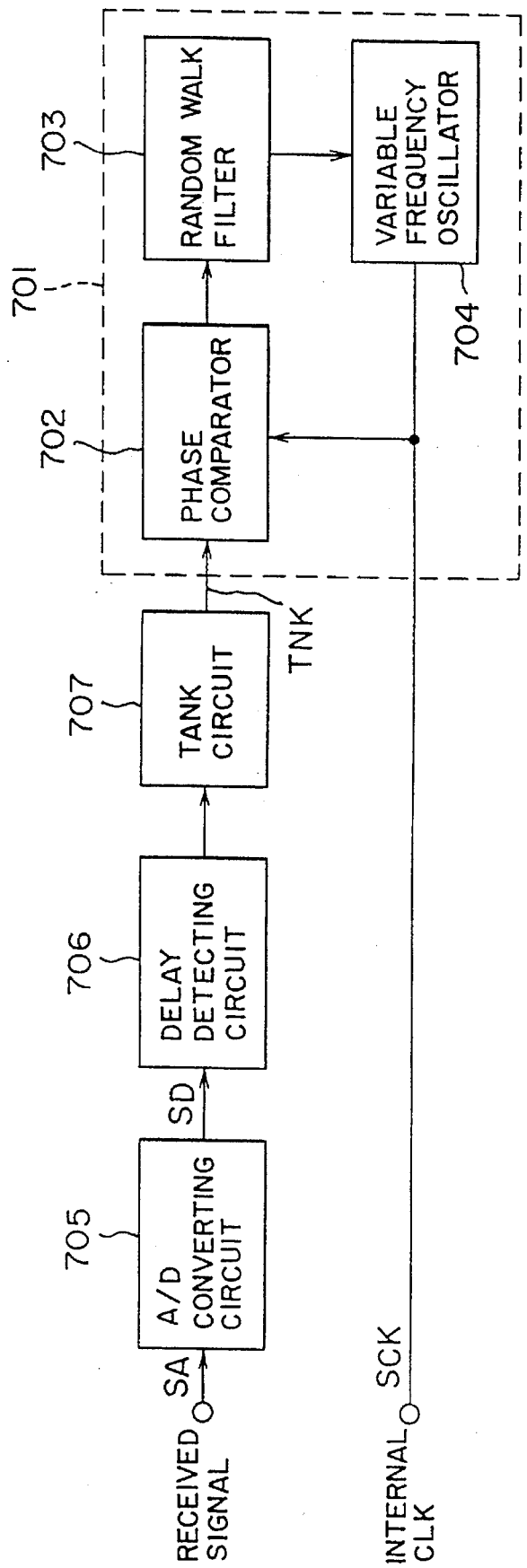
FIG. 8 is a block diagram showing a conventional digital phase-locked loop circuit.

A 12-bit received clock component extracting signal TNK is generated by a TANK circuit (as shown in FIG. 8) provided in a modem and the generated signal TNK is supplied to the phase comparator 102, as shown in FIGS. 1 and 2. The phase relationship waveforms between the received clock component extracting signal TNK and the actual received clock are depicted in FIGS. 7A and 7B. As depicted in FIG. 7B, the received clock component extracting signal TNK is supplied to the phase comparator 102 with ⅛ period out of phase (being delayed) with respect to the received clock. The supplied received clock component extracting signal TNK is first extended by a sign extension circuit 201 from 12 bits to 16 bits, and then supplied to a sampling register 202 as shown in FIG. 2.

In addition, the phase comparator 102 receives an internal clock SCK (an output clock in this embodiment) and another internal clock $SCK_8$ having frequency 8 times higher than that of the internal clock SCK from the variable-frequency oscillator 104. The received internal clock SCK is supplied to a shift register 203 composed of three-stage flip-flop circuits 204, 205 and 206, as shown in FIG. 2. Furthermore, the internal clock SCK8 is supplied to the respective flip-flop circuits 204, 205 and 206 as a shift clock, as shown also in FIG. 2. Therefore, it is possible to output a clock signal delayed in phase by ⅜ period from the internal clock SCK from the shift register 203. This delayed signal is referred to as a sampling signal ACK. As shown in FIG. 7D, the phase of this sampling signal ACK is delayed by ½ period from that of the received clock component extracting signal TNK.

The sampling register 202 receives the 16-bit received clock component extracting signal TNK outputted by the sign extending circuit 201 at a time when the sampling clock ACK rises.

Here, as depicted in FIGS. 7A–7D, when the phase of the internal clock SCK matches the phase of the actual received clock, the level of the received clock component extracting signal is zero at the timing when the sampling clock ACK rises. In other words, when the output level of the signal TNK' of the sampling register 202 is zero at the rise edge of the sampling clock ACK, the received clock is in phase with the internal clock SCK.

On the other hand, when the phase of the sampling clock ACK is advanced (shifted in the leftward in FIGS. 7A–7D) with respect to the phase of the received clock component extracting signal TNK, the output level TNK' of the sampling register 202 is at a positive level. Further, arc sine ($\sin^{-1}$) of this output level TNK' is proportional to the phase difference between the two signals ACK and TNK.

Further, when the phase of the sampling clock ACK is delayed (shifted in the rightward in FIGS. 7A–7D) with respect to the phase of the received clock component extracting signal TNK, the output level TNK' of the sampling register 202 is at a negative level. Further, the arc sine ($\sin^{-1}$) of the absolute value of this output level TNK' is proportional to the phase difference between the two signals ACK and TNK.

Further, the sampling register 202 is cleared by a clear signal CL generated by the random walk filter 103 (described later).

As described above, the output level TNK' of the sampling register 202 provides information indicative of the phase shift amount and the phase shift direction thereof. The output value TNK' is supplied to the random walk filter 103, as shown in FIG. 3.

Further, the phase comparator 102 outputs the given received clock component extracting signal TNK and the sampling clock ACK generated by the shift register 203 to an operation status detecting circuit 106, respectively.

Figure 3:
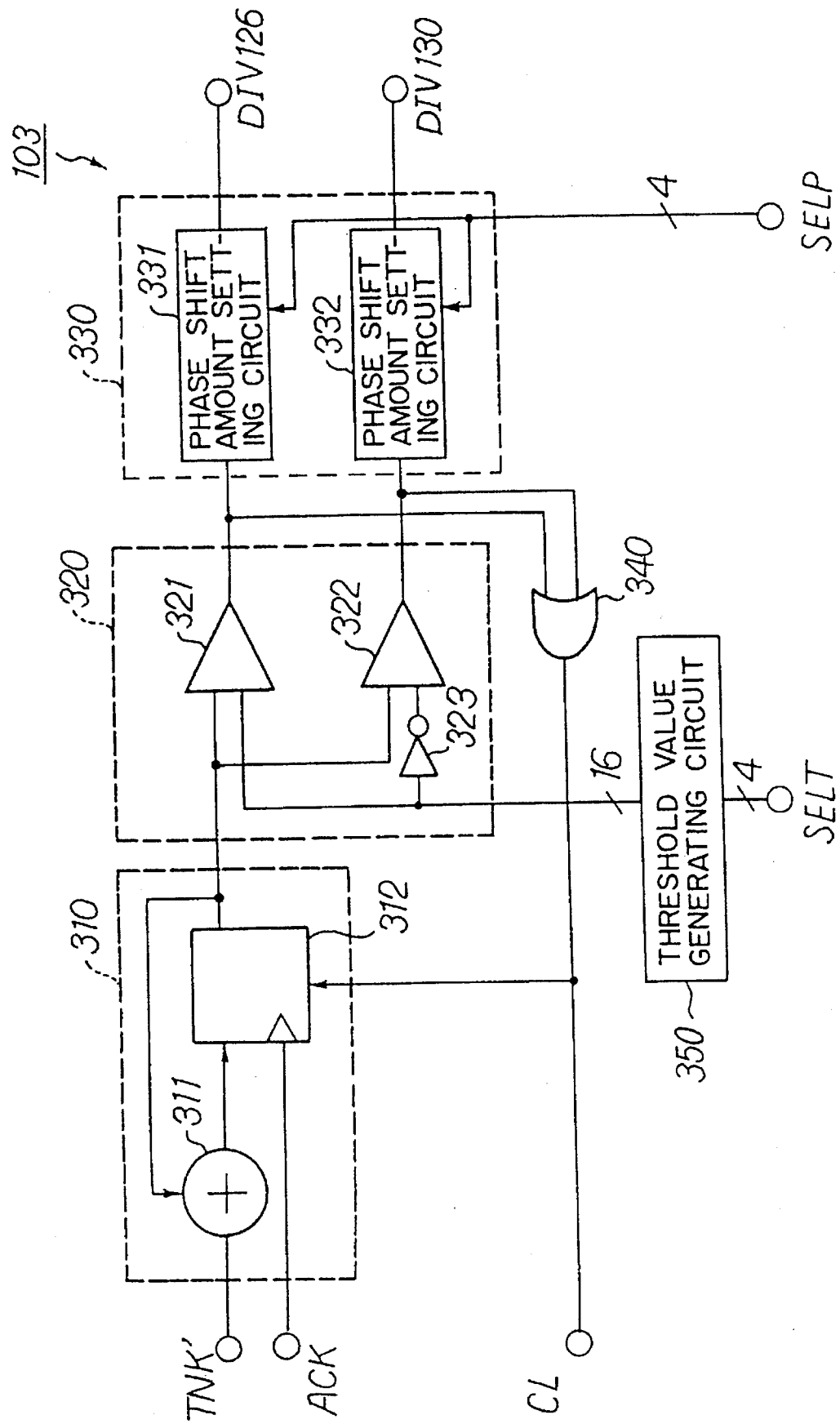
FIG. 3 is a block diagram showing the internal circuit configuration of the random walk filter shown in FIG. 1.

With reference to FIG. 3, the random walk filter 103 is composed of an accumulation section 310, a discrimination section 320, a frequency change signal generation section 330, an OR circuit 340, and a threshold value generating circuit 350.

An adder 311 in the accumulation section 310 adds the output value TNK' of the sampling register 202 to the output value of the accumulator 312 and then outputs an addition data. The addition data is stored in the accumulator 312 at a timing when the sampling clock ACK rises. Therefore, the output values TNK' of the sampling register 202 are added in sequence and stored in the accumulator 312, and then outputted to the discrimination section 320.

Here, as already explained, the output value TNK' of the sampling register 202 is positive when the phase of the sampling clock ACK is advanced (leading) with respect to the phase of the received clock component extracting signal TNK, but is negative when the phase of the sampling clock ACK is delayed (lagging) with respect to the phase of the received clock component extracting signal TNK. Accordingly, the addition data of the accumulation section 310 is a positive value when the sampling clock ACK leads in phase, but a negative value when lags in phase. Further, in the case where the phase of the sampling clock ACK changes so as to lead and lag with respect to the phase of the received clock component extracting signal TNK' under mixture conditions, since the output values of the sampling register 202 are canceled each other, the addition data value of the accumulation section 310 becomes zero or almost zero.

The discrimination section 320 receives the addition data from the accumulation section 310, and compares the received addition data with two threshold values (a threshold ±C). That is, the discrimination section 320 is composed of two comparators 321 and 322. The comparator 321 is turned on (i.e. it outputs a high-level signal) when the addition data received from the accumulation section 310 is higher in level than a threshold value +C. On the other hand, the comparator 322 is turned on (i.e. it outputs a high level signal) when the inputted addition data outputted from the accumulation section 310 is lower in level than a threshold value C.

Here, the positive threshold value (a threshold +C) (16 bits) is generated by a threshold generating circuit 350 on the basis of a 4-bit threshold information SELT inputted by a parameter setting circuit 105 (described later). Further, the negative threshold value (a threshold −C) is obtained as an output of a NOT circuit 323 to which the positive threshold value (a threshold +C) is supplied.

As described above, when the phase of the sampling clock ACK is delayed from the phase of the received clock component extracting signals, only the comparator 321 is turned on, and when the phase of the sampling clock ACK is advanced from the phase of the received clock component extracting signals, only the comparator 322 is turned on. Further, as described above, when the phase of the sampling clock ACK changes so as to lead and lag with respect to the phase of the received clock component extracting signal TNK' under mixture conditions, since the addition data value of the accumulation section 310 is zero or almost zero, the two comparators 321 and 322 are both turned off.

When one of the comparators 321 and 322 is turned on, the OR circuit 340 outputs a clear signal CL to clear the accumulator 312 of the accumulation section 310 and the sampling register 202 (see FIG. 2) of the phase comparator 102.

The frequency change signal generating section 330 is composed of two phase shift amount setting circuits 331 and 332. The phase shift amount setting circuit 331 outputs a high-level frequency change signal DIV126 when the comparator 321 is turned on. Further, the phase shift amount setting circuit 332 outputs a high-level frequency change signal DIV130 when the comparator 322 is turned on. The high-level durations (pulse widths) of these frequency change signals DIV126 and DIV130 are determined on the basis of a 4-bit phase shift amount information signal SELP inputted by a filter coefficient generating circuit 105 (described later).

Figure 4:
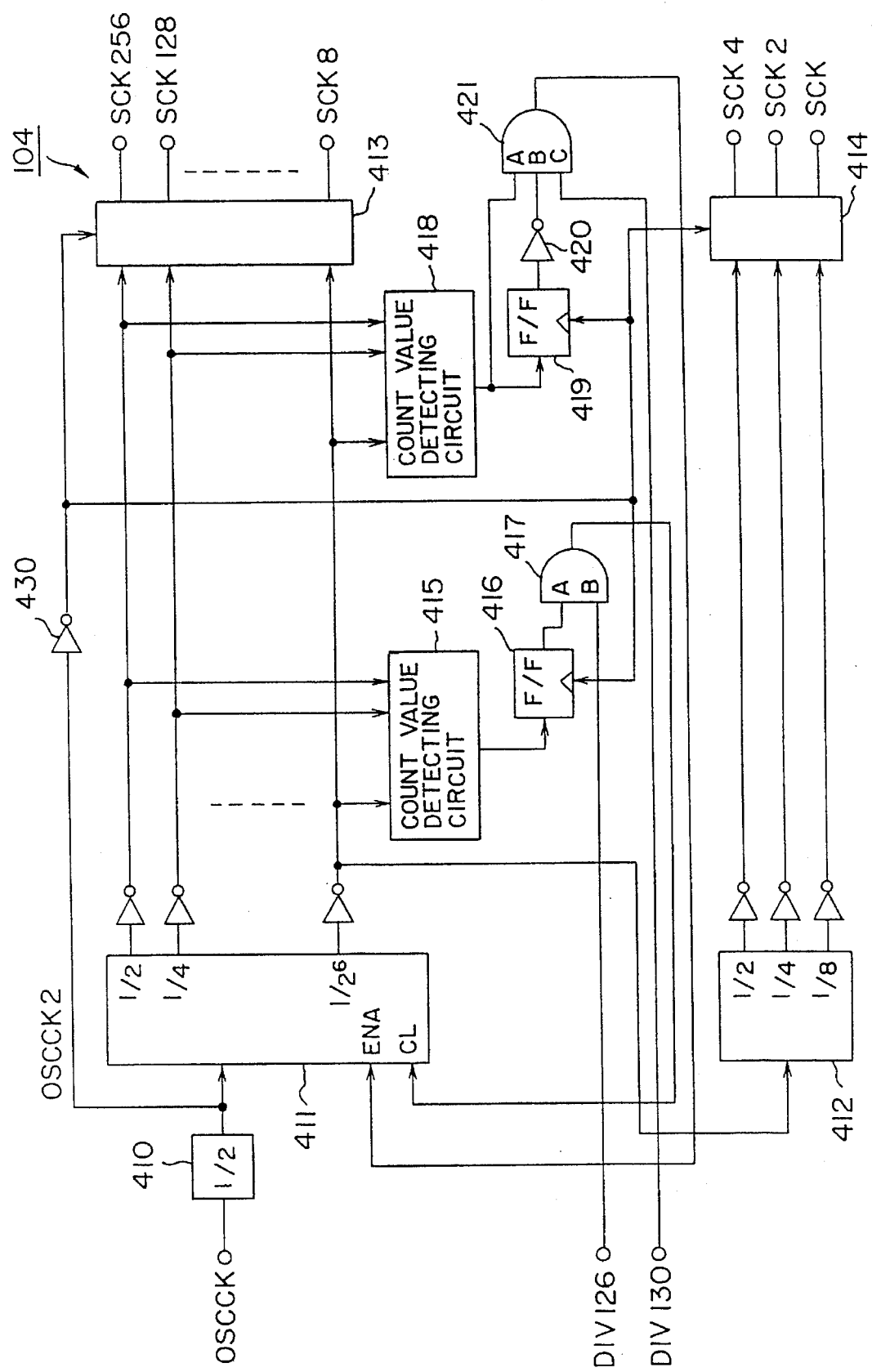
FIG. 4 is a block diagram showing the internal circuit configuration of the variable frequency oscillator circuit shown in FIG. 1.

With reference to FIG. 4, the variable-frequency oscillator 104 generates clock signals such as internal clocks SCK and further changes the frequencies of these clock signals in accordance with the frequency change signals DIV126 and DIV 130 supplied by the random walk filter 103.

In FIG. 4, a divider circuit 410 receives a clock signal OSCCK supplied by a quartz oscillator (not shown) provided outside of the variable-frequency oscillator 104, divides the frequency thereof into ½, and outputs a clock signal OSCCK2. On the basis of this clock signal OSCCK2, another divider circuit 411 outputs clock signals having frequencies of $\frac{1}{2}^n$ (n=1, 2, . . . , 6) of the clock signals OSCCK2, respectively. The divider circuit 411 may be a binary counter (up-counter in this embodiment). In more detail, the first bit of the binary counter is used as a clock having a frequency ½ times that of OSCCK2 (referred to ½ time clock); the second bit of the binary counter is used as a $\frac{1}{2}^2$ (=¼) time clock; the third bit of the binary counter is used as a $\frac{1}{2}^3$ (=⅛) time clock, and so on. That is, the respective bits of the binary counter are the outputs of the divided clocks. After having counted the clock signal from "0" to "63", the binary counter repeats the count from "0".

Further, a divider circuit 412 receives a $\frac{1}{2}^6$ (=1/64) time clock (after inverted through a NOT circuit), and outputs further divided $\frac{1}{2}^n$ (n=1, 2 and 3) time clocks, respectively. As for the divider circuit 412, a binary counter may be used.

Further, as the divider circuits 411 and 412, it is also possible to use a 9-bit binary counter by allocating 6 higher-significant bits to the divider circuit 411 and 2 lower-significant bits to the divider circuit 412.

The outputs of these divider circuits 411 and 412 are inverted through NOT circuits and then supplied to two flip-flop circuits 413 and 414, respectively. Therefore, it is possible to output internal clocks SCK, SCK2, SCK4, SCK8, . . . SCK256 from the two flip-flop circuits 413 and 414, respectively. Further, as a drive clock for triggering these flip-flop circuits 413 and 414, the output clock OSCCK2 of the divider circuit 410 is used after inverted through a NOT circuit 430. As described above, it is possible to output respective internal clocks SCK, SCK2, SCK4, . . . , SCK256 in phase with each other by using the two flip-flop circuits 413 and 414, respectively.

A count value detecting circuit 415 receives the respective outputs of the divider circuit 411. When the output signal of the divider circuit 411 becomes the 63th clock of the clock signal OSCCK2, the output level of the count value detecting circuit 415 is turned on (changes to the high-level). For instance, in the case where the an up-counter is used for the divider circuit 411, when the output value of the up-counter becomes "111101" ("62" in decimal number), the output of the count value detecting circuit 415 outputs a high-level signal.

The output of the count value detecting circuit 415 is supplied to a flip-flop circuit 416. Further, as the drive clock of the flip-flop circuit 416, the output (clock signal OSCCK2) of the divider circuit 410 is used. Therefore, the output of the count value detecting circuit 415 is supplied to an input terminal A of an AND circuit 417 at the same timing of the internal clocks SCK to SCK256.

To an input terminal B of this AND circuit 417, the frequency change signal DIV126 outputted by the random walk filter 103 is supplied. Further, the output of the AND circuit 417 is used as a clear signal of the divider circuit 411. Therefore, when the output of the count value detecting circuit 415 and the frequency change signal DIV126 are both turned on (the high-level), since the output of the AND circuit 417 is also at the high-level, the divider circuit 411 is cleared. In other words, when the frequency change signal DIV126 is at the high-level (the phase of the sampling clock ACK is delayed from the phase of the received clock component extracting signal), the period of the internal clock SCK8 is shortened by one clock of the clock signal OSCCK2, so that this corresponds to the 63 clocks (i.e., 126 clocks of OSCCK). Further, the periods of the internal clocks SCK4, SCK2 and SCK are shortened to that extent. Therefore, since the start of the succeeding internal clock (at the clock fall edges when the divider circuits 411 and 412 are up-counters) can be advance to that extent, it is possible to bring the phase of the sampling clock ACK close to the phase of the received signal extracted-component signal TNK.

As described above, when the divider circuit 411 is cleared once by the count value detecting circuit 415, it is possible to shorten the period of the internal clock SCK8 by one clock of the clock signal OSCCK2. Therefore, when the period of the internal clock is required to be shortened by two clocks of the clock signal OSCCK2, the turn-on (high-level) duration of the frequency change signal DIV126 is determined so as to correspond to two clocks of the internal clock SCK8. As described above, it is possible to decide the phase shift amounts of the internal clocks SCK, SCK8, . . . , etc. on the basis of the turn-on duration of the frequency change signal DIV126. Further, the above-mentioned turn-on duration is determined by the phase shift amount information SELP applied to the frequency change signal generating section 330.

Further, the respective output clocks of the divider circuit 411 are also supplied to the counter value detecting circuit 418. When the output signal of the divider circuit 411 becomes 64th clock of the clock signal OSCCK2, the output of the count value detecting circuit 418 is turned on (high-level). For instance, if the divider circuit 411 is an up-counter, when the output value of the up-counter is "111111" ("63" in decimal number), the output of the count value detecting circuit 418 changes to the high-level.

The output of the count value detecting circuit 418 is supplied to an input terminal A of an AND circuit 421 and a flip-flop circuit 419. Here, since the clock OSCCK2 outputted by the divider circuit 410 is used as a drive clock of the flip-flop circuit 419, the output of the flip-flop 419 (after inverted by a NOT circuit 420) is supplied to an input terminal B of the AND circuit 421 at the same timing of the internal clocks SCK to SCK256. Further, the frequency change signal DIV130 is supplied to the other input terminal C of the AND circuit 420. Further, the output of the AND circuit 421 is supplied to the divider circuit 411 as an enable signal.

Here, when the frequency change signal DIV130 is turned off (the low-level), the output of the AND circuit 421 is always as the low-level, so that the divider circuit 411 is activated to repeat the ordinary counting operation.

On the other hand, when the frequency change signal DIV130 is turned on (the high-level), the output level of the AND circuit 421 is determined by the output of the count value detecting circuit 418. That is, when the output of the count value detecting circuit 418 is turned off (the low-level), the input terminal B of the AND circuit 421 is at the high-level. However, since the input terminal A thereof is at the low-level, the output of the AND circuit 421 is at the low-level, so that the divider circuit 411 is activated.

When the output of the count value detecting circuit 418 changes from the low-level to the high-level as described above, thereafter, since the input terminals of the AND circuit 421 are all at the high-level, the output of the AND circuit 421 is at the high-level, so that the divider circuit 411 is deactivated. As long as the divider circuit 411 is being deactivated, the output value of the divider circuit 411 does not change, so that "111111" is kept outputted. However, when the succeeding clock OSCCK2 is inputted from the divider circuit 410, since the input level of the input terminal B of the AND circuit 421 is inverted, the output of the AND circuit 421 changes again to the low-level, so that the divider circuit 411 is activated again.

That is, when the output of the divider circuit 411 is "111111" under the condition that the frequency change signal DIV130 is turned on (the phase of the sampling clock ACK is advanced from the phase of the received clock component extracting signal TNK), the divider circuit 411 stops for a time duration corresponding to one clock of the clock signal OSCCK2. Therefore, since lengthened by one clock of the clock signal OSCCK2, the period of the internal clock SCK8 becomes the 65 clocks (130 clocks of the clock signal OSCCK). Further, the periods of the internal clocks SCK4, SCK2 and SCK are lengthened to that extent. Therefore, since the start of the succeeding internal clock (at the clock rise edges when the divider circuits 411 and 412 are up-counters) can be delayed to that extent, it is possible to bring the phase of the sampling clock ACK close to the phase of the received signal extracted-component signal TNK.

As described above, when the divider circuit 411 is stopped once by the count value detecting circuit 418, it is possible to lengthen the period of the internal clock SCK8 by one clock of the clock signal OSCCK2. Therefore, when the period of the internal clock is required to be lengthened by two clocks of the clock signal OSCCK2, the high-level duration of the frequency change signal DIV130 is determined so as to correspond to two clocks of the internal clock SCK8. As described above, it is possible to decide the phase shift amounts of the internal clocks SCK, SCK8, etc. on the basis of the turn-on duration of the frequency change signal DIV130. Further, the above-mentioned turn-on duration is determined by the phase shift amount information SELP applied to the frequency change signal generating section 330 (shown in FIG. 3) of the random walk filter 103.

Figure 5:
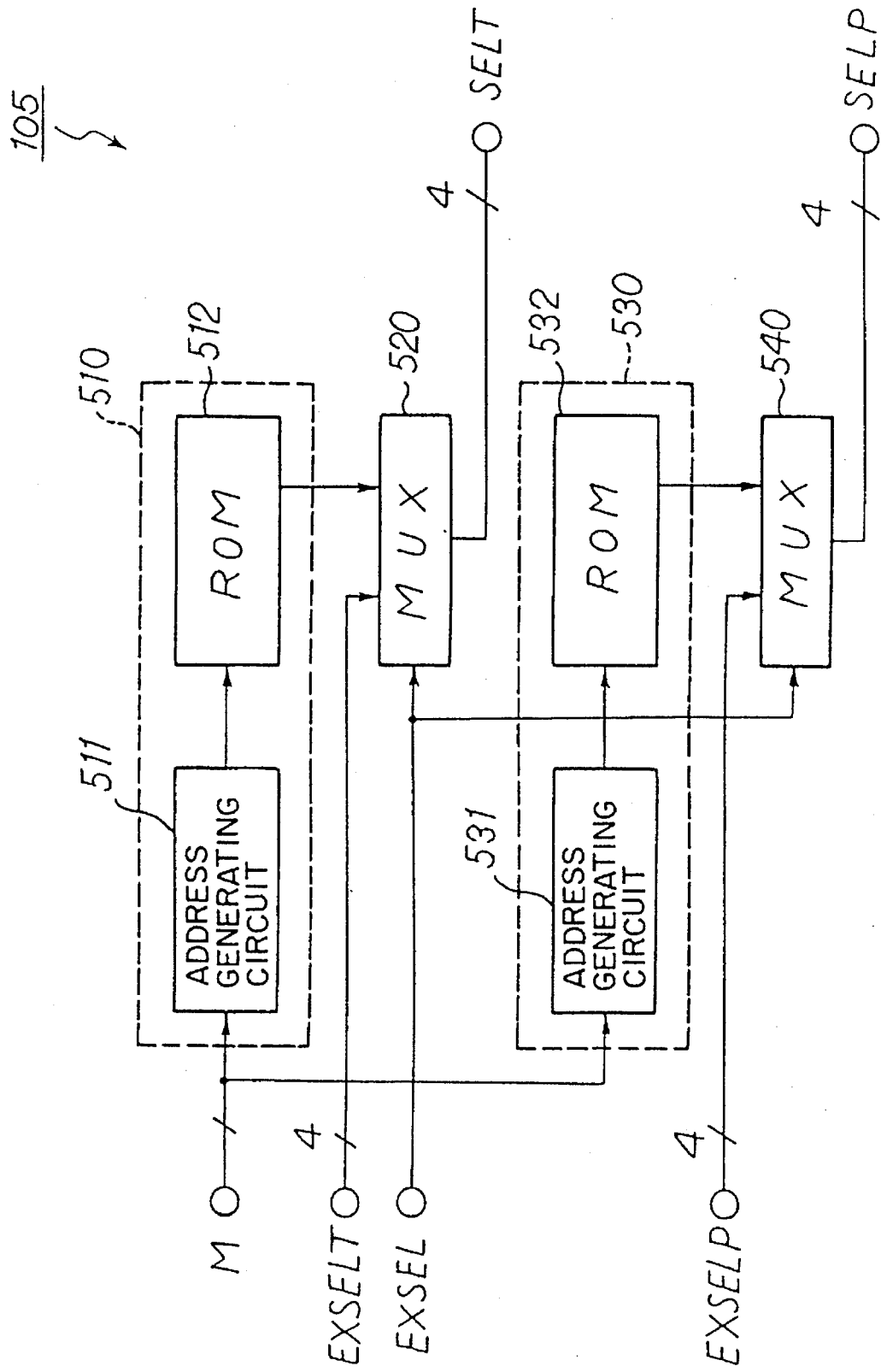
FIG. 5 is a block diagram showing the internal circuit configuration of the filter coefficient generating circuit shown in FIG. 1.

With reference to FIG. 5, the filter coefficient generating circuit 105 outputs a threshold value information SELT and the phase shift amount information SELP to the random walk filter 103.

Here, with respect to the filter coefficient information (threshold value information SELT and the phase shift amount information SELP) outputted by the filter coefficient generating circuit 105, there are information generated inside the filter coefficient generating circuit 105 (referred to as internal filter coefficients, hereinafter) and information generated outside the filter coefficient generating circuit 105 (referred to as external filter coefficients, hereinafter).

Further, there are intermittent reception mode for selecting the internal filter coefficients and continuous reception mode. The intermittent reception mode is used at the initial synchronous operation (when the phase difference is large), during which the threshold value is determined to be relatively low and the phase shift amount is determined to be relatively large in order to reduce the phase difference to zero within a short time. Further, the continuous reception mode is used at the continuous reception operation (when the phase difference is small), during which the threshold value is determined to be relatively high and the phase shift amount is determined to be relatively small in order to realize a high precise matching operation. Any one of the intermittent and continuous reception modes may be selected on the basis of a one-bit operation mode signal M.

On the other hand, the external filter coefficients can be formed by a CPU (not shown), and supplied to the filter coefficient generating circuit 105 as the external threshold value information EXSELT (4-bits) and the external phase shift amount information EXSELP (4-bits). Any of the internal filter coefficients and the external filter coefficients are selectively adopted on the basis of a select signal EXSEL supplied from the CPU to the filter coefficient generating circuit 105.

In FIG. 5, the threshold value information generating circuit 510 forms and outputs the internal threshold value information in response to the operation mode signal M inputted from an operation status detecting circuit 106 (described later).

The operation mode signal M supplied to the threshold value information generating circuit 510 is received by an address generating circuit 511. The address generating circuit 511 generates an address signal according to the inputted operation mode signal M and outputs the address signal to a ROM (read only memory) 512. The ROM 512 outputs a 4-bit memory information (the internal threshold value information in the intermittent or continuous reception mode) according to the address signal applied by the address generating circuit 511.

The outputted internal threshold value information is supplied to a multiplexer 520. The multiplexer 520 receives the internal threshold value information and the external threshold value information EXSELT, and outputs the internal threshold value information when the select signal EXSEL designates the internal filter coefficients and the external threshold value information when the select signal EXSEL designates the external filter coefficients, respectively.

Further, a phase shift amount information generating circuit 530 forms and outputs the internal shift amount information according to the operation information M.

The operation mode signal M supplied to the phase shift amount information generating circuit 530 is acquired by the address generating circuit 531. When the address generating circuit 531 outputs an address signal according to the operation mode information signal M, the ROM 532 outputs a 4-bit memory information (the internal phase shift amount information in the intermittent or continuous reception mode) according to the address signal applied by the address generating circuit 531.

The outputted internal phase shift amount information is supplied to a multiplexer 540. The multiplexer 540 receives the internal phase shift amount information and the external phase shift amount information EXSELP, and outputs the internal phase shift amount information when the select signal EXSEL designates the internal filter coefficients and the external phase shift amount information when the select signal EXSEL designates the external filter coefficients, respectively.

Further, in this embodiment, although the internal filter coefficients are stored in the ROMs 512 and 532, without being limited thereto, it is also possible to generate the internal filter coefficients by use of random gates or hardwired (wiring logic).

The threshold value information SELT and the phase shift amount information SELP are transmitted to the random walk filter 103 as shown in FIG. 3.

With reference to FIG. 6, the operation status detecting circuit 106 receives the received clock component extracting signal TNK, etc. and outputs the operation mode signal M.

In FIG. 6, an amplitude detecting circuit 601 receives the received clock component extracting signal TNK and detects the absolute values of the signal amplitudes. When the absolute value of the signal amplitude is smaller than a predetermined value, the amplitude detecting circuits 601 determines that the received clock is not supplied to the DPLL circuit 101 and turns off the output signal OVER (a low-level). On the other hand, when the absolute value of the amplitude of the received clock component extracting signal TNK is larger than a predetermined value, the amplitude detecting circuits 601 determines that the received clock is supplied to the DPLL circuit 101 and turns on the output signal OVER (a high-level). This predetermined value is set to be almost zero in usual condition. Further, the above-mentioned operation is repeated at time intervals shorter than the period of the phase matching in the intermittent reception mode (i.e., from the start of the synchronous operation to the shift to the continuous mode) or than the period of the received clock component extracting signal TNK. Therefore, in this embodiment, the internal clock SCK8 supplied from the variable frequency oscillator 104, as shown in FIG. 4, is used as this timing signal.

A register 602 receives the output signal OVER from the amplitude detecting circuit 601, and outputs this signal at a time when the internal clock SCK8 rises (at the succeeding rise timing of amplitude detection by the amplitude detecting circuit 601). The output signal of the register 602 is inverted by a NOT circuit 603 and then supplied to one input terminal B of an AND circuit 604. Further, the output signal OVER of the amplitude detecting circuit 601 is supplied as it is to the other input terminal A of the AND circuit 604.

In the circuit described above, when the signal OVER changes from the low-level to the high-level, the input terminals A and B of the AND circuit 604 change from the status where the terminal A is at the low-level and the terminal B is at the high-level to the status where both the terminals A and B are at the high-level. Further, after one clock of the internal clock SCK8, the terminal A changes to the high-level and the terminal B changes to the low-level. Therefore, when the signal OVER changes from the low-level to the high-level, a clock whose pulse width is the same as the internal clock SCK8 is outputted. On the other hand, when the signal OVER changes from the high-level to the low-level, the output of the AND circuit 604 is kept unchanged.

A delay circuit 605 delays this output clock by a predetermined time (e.g., approx. 20 msec) and outputs the delayed clock.

On the other hand, when the signal OVER changes from the high-level to the low-level, since the output of the AND circuit 604 is kept unchanged, the output of the delay circuit 605 is kept at the low-level.

Further, the output signal OVER of the amplitude detecting circuit 601 is also supplied to a register 606. This signal OVER is outputted by the register 606 at the same timing as the register 602. The output signal of the register 606 is inverted by a NOT circuit 607 and then supplied to one input terminal B of a NOR circuit 608. Further, the output signal OVER of the amplitude detecting circuit 601 is inputted as it is to the other input terminal A of the NOR circuit 608. The output signal of the NOR circuit 608 is supplied to one input terminal A of an OR circuit 609, and a reset signal RST is supplied to the other input terminal B of the OR circuit 609.

In the circuit construction as described above, when the signal OVER changes from the low-level to the high-level, the output of the NOR circuit 608 does not change, so that the output of the OR circuit 609 also does not change.

On the other hand, when the signal OVER changes from the high-level to the low-level, the input terminals A and B of the NOR circuit 608 change from the status where the terminal A is at the high-level and the terminal B is at the low-level to the status where both the terminals A and B are at the low-level. Further, after one clock of the internal clock SCK8, the terminal A changes to the low-level and the terminal B changes to the high-level. Therefore, when the signal OVER changes from the high-level to the low-level, a clock whose pulse width is the same as the internal clock SCK8 is outputted. This clock is outputted by the OR circuit 609. Further, the output of the OR circuit 609 is unchanged when the reset signal RST is applied thereto.

An RS latch circuit 610 receives the output of the delay circuit 605 at an input terminal R and the output of the OR circuit 609 at an input terminal S. Therefore, when a clock is applied from the delay circuit 605, the RS latch circuit 610 changes from the high-level to the low-level. Thereafter, when the clock (the output clock of the NOR circuit 608 or the reset signa RST) is inputted from the OR circuit 609, the RS latch circuit 610 changes from the low-level to the high-level.

A register 611 outputs the signal supplied by the RS latch circuit 610 as the operation mode signal M at the timing at which the sampling signal ACK (see FIGS. 2 and 7D) is given.

In the operation status detecting circuit 106 configured as described above, when the received clock is not supplied to the DPLL circuit 101 (i.e., the absolute of the amplitude of the received clock component extracting signal TNK is less than a predetermined value) or within a predetermined time period from when the received clock is supplied to the DPLL circuit 101 and to when the synchronous operation starts (about 20 msec in this embodiment), the operation mode signal M is at the high-level, so that the intermittent reception mode is designated. On the other hand, after the predetermined time has elapsed, the operation mode signal M changes to the low-level, so that the continuous reception mode is designated.

As described above, in the DPLL circuit 101 according to the present invention, it is possible to change the set values of the filter coefficients (the threshold value and the phase shift amount) automatically between the intermittent reception mode (for about 20 msec after the start of the phase synchronous operation) and the continuous reception mode (thereafter). Accordingly, in the initial synchronism period (in which the phase difference is relatively large), the threshold value can be determined to be relatively small and the phase shift amount can be determined to be relatively large. On the other hand, in the continuous reception period (in which the phase difference is relatively small), the threshold value can be determined to be relatively large and the phase shift amount can be determined to be relatively small.

In other words, in the DPLL circuit 101 according to the present invention, since it is possible to control the turn on condition of the frequency change signals DIV126 and DIV130 generated by the random walk filter 103, or to change the turn-on duration of these signals according to the phase difference rate, it is possible to realize a high precise phase matching within a short time.

Further, the present invention is not limited to only the above-mentioned embodiment. For instance, in the embodiment, the start of the synchronous operation is detected, and the intermittent reception mode is shifted to the continuous reception mode 20 msec after the start of the synchronous operation has been detected. Without being limited thereto, it is possible to decide the shift timing to the continuous reception mode on the basis of a control signal supplied from an external CPU. For instance, when the DPLL circuit 101 is incorporated into a portable radio telephone set, it is possible to shift the intermittent reception mode to the continuous reception mode when the user depresses a button to generate a control signal.

Further, in the embodiment, the operation mode signal M is a 1-bit signal, and two different filter coefficients are used. Without being limited thereto, it is also possible to use the operation mode signal M of 2 or more bits and to switch among three or more different coefficients.

Further, in the present invention, although the threshold value and the phase shift amount are both changed, it is also possible to obtain a sufficient effect by changing only one of them.

As described above, in the digital phase-locked loop circuit according to the present invention, since the threshold value information used in the discrimination section of the filter means and the phase shift amount information used in the frequency change signal generating section can be changed appropriately according to the phase synchronous conditions with the use of the filter coefficient generating means or according to the control signals inputted from outside, it is possible to enable a high precise phase matching at a high speed.

Therefore, when compared with the conventional DPLL circuit, since the appropriate operation mode can be obtained with the duration time information and the received signal amplitude information in the operation mode previously determined in the system, without controlling the inertia on the basis of only the direct mismatching information, it is possible to decide an optimum inertia more accurately.

What is claimed is:

1. A digital phase-locked loop circuit, operable with an oscillator signal, for generating an output clock and for synchronizing the output clock with an input clock by shifting phase of the output clock, the digital phase-locked loop circuit comprising:

phase comparing means for sequentially comparing the input clock with the output clock in phase and outputting comparison result signals;

a random walk filter having:
   an accumulation section for sequentially adding and accumulating the comparison result signals supplied from said phase comparing means and outputting the added and accumulated data as addition data;
   a discrimination section, responsive to a threshold value information signal, for discriminating a relative magnitude between the addition data supplied from said accumulation section and outputting a discriminated result; and
   a frequency change signal generating section, responsive to a phase shift amount information signal, for outputting a frequency change signal based on the phase shift amount information signal and the discriminated result inputted by said discrimination section;

oscillating means for generating the output clock and an internal clock signal and for changing frequency of the output clock according to the frequency change signal supplied from said random walk filter, wherein the internal clock signal represents a subdivision of the oscillator signal;

filter coefficient generating means, responsive to an operation mode signal, for outputting the threshold value information signal to the discrimination section and for outputting the phase shift amount information signal to the frequency change signal generating section, so that at least one of the outputted threshold value information signal and the phase shift amount information signal is changed according to the operation mode signal, wherein the threshold value information signal and the phase shift amount information signal are prestored in the filter coefficient generating means and are selected in response to the operator mode signal; and operation status detecting means, responsive to a change in amplitude of the input clock and the internal clock signal from the oscillating means, for outputting the operation mode signal to the filter coefficient generating means.

2. The digital phase-locked loop circuit according to claim 1, wherein said filter coefficient generating means has means for changing and outputting the threshold value information signal in such a way that a threshold value is determined to be small when a phase difference between the input and output clocks is larger than a predetermined value, but to be large when the phase difference between the input and output clocks is smaller than the predetermined value.

3. The digital phase-locked loop circuit according to claim 1, wherein said filter coefficient generating means has means for changing and outputting the phase shift amount information signal in such a way that a phase shift amount is determined to be large when a phase difference between the input and output clocks is larger than a predetermined value, but to be small when the phase difference between the input and output clocks is smaller than the predetermined value.

4. The digital phase-locked loop circuit according to claim 1, wherein said filter coefficient generating means has means for changing and outputting the threshold value information signal in such a way that a threshold value is determined to be small within a predetermined time period after an initiation of a phase synchronous operation of the input and output clocks, but to be large after the predetermined time period has elapsed.

5. The digital phase-locked loop circuit of claim 4, which further comprises operation status detecting means for detecting a start of the synchronous operation on the basis of change in amplitude of the input clock and outputting a detected signal to said filer detecting means.

6. The digital phase-locked loop circuit according to claim 1, wherein said filter coefficient generating means has means for changing and outputting the phase shift amount information signal in such a way that a phase shift amount is determined to be large within a predetermined time period after the phase synchronous operation between the input and output clocks starts, but to be small after the predetermined time period has elapsed.

7. The digital phase-locked loop circuit of claim 6, which further comprises operation status detecting means for detecting a start of the synchronous operation on the basis of change in amplitude of the input clock and outputting a detected signal to said filer detecting means.

8. The digital phase-locked loop circuit according to claim 1, wherein said operating mode signal of said operation status detecting means represents a transition from an intermittent reception mode to a continuous operation mode after the elapse of a predetermined time from the detection of a start of a synchronous operation.

9. The digital phase-locked loop circuit according to claim 8, wherein the threshold value information signal from the filter coefficient generating means includes a small threshold value, and the phase shift amount information signal from the filter coefficient generating means includes a large phase shift amount when a phase difference between the input and output clocks is larger than a predetermined value, and the threshold value information signal includes a large threshold value, and the phase shift amount information signal includes a small phase shift amount when the phase difference between the input and output clocks is smaller than the predetermined value.

10. A digital phase-locked loop circuit, operable with an oscillator signal and an external control signal, for generating an output clock and for synchronizing the output clock with an input clock by shifting phase of the output clock, the digital phase-locked loop circuit comprising:

phase comparing means for sequentially comparing the input clock with the output clock in phase and outputting comparison result signals;

a random walk filter having:
- an accumulation section for sequentially adding and accumulating the comparison result signals supplied from said phase comparing means and outputting the added and accumulated data as addition data;
- a discrimination section, responsive to a threshold value information signal, for discriminating a relative magnitude between the addition data supplied from said accumulation section and outputting a discriminated result; and
- a frequency change signal generating section, responsive to a phase shift amount information signal, for outputting a frequency change signal based on the phase shift amount information signal and the discriminated result supplied from said discrimination section;

oscillating means for generating the output clock and an internal clock signal and for changing frequency of the output clock according to the frequency change signal supplied from said random walk filter, wherein the internal clock signal represents a subdivision of the oscillator signal;

filter coefficient generating means, responsive to the external control signal, for outputting the threshold value information signal to the discrimination section and for outputting the phase shift amount information signal to the frequency change signal generating section, so that at least one of the outputted threshold value information signal and the phase shift amount information signal is changed in response to the external control signal.

11. The digital phase-locked loop circuit according to claim 10, wherein the external control signal for controlling the filter coefficient generating means is generated from an external processor.

* * * * *